(12) United States Patent
Kadu

(10) Patent No.: US 11,948,653 B2
(45) Date of Patent: Apr. 2, 2024

(54) EARLY ERROR DETECTION AND AUTOMATIC CORRECTION TECHNIQUES FOR STORAGE ELEMENTS TO IMPROVE RELIABILITY

(71) Applicant: Avago Technologies International Sales Pte. Limited, Singapore (SG)

(72) Inventor: Sachin Prabhakarrao Kadu, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 215 days.

(21) Appl. No.: 17/381,143

(22) Filed: Jul. 20, 2021

(65) Prior Publication Data

US 2023/0027273 A1 Jan. 26, 2023

(51) Int. Cl.
*G11C 29/42* (2006.01)
*G11C 29/12* (2006.01)
*G11C 29/44* (2006.01)

(52) U.S. Cl.
CPC .......... *G11C 29/42* (2013.01); *G11C 29/1201* (2013.01); *G11C 29/4401* (2013.01)

(58) Field of Classification Search
None
See application file for complete search history.

(56) References Cited

U.S. PATENT DOCUMENTS

| | | | | |
|---|---|---|---|---|
| 5,867,507 A * | 2/1999 | Beebe | ............ | G01R 31/318558 714/726 |
| 6,668,237 B1 * | 12/2003 | Guccione | ....... | G01R 31/318516 702/119 |
| 7,187,597 B1 * | 3/2007 | Trimberger | .......... | G11C 29/816 365/189.12 |
| 7,409,610 B1 * | 8/2008 | Drimer | .............. | G01R 31/3187 365/201 |
| 7,746,699 B1 * | 6/2010 | Edwards | .............. | H03K 19/177 365/185.09 |
| 8,332,722 B1 | 12/2012 | Vera Rojas et al. | | |
| 10,825,541 B1 * | 11/2020 | Fu | ........................... | G11C 29/10 |
| 2002/0069383 A1 * | 6/2002 | Ni | .......................... | G11C 29/10 714/720 |
| 2003/0218925 A1 * | 11/2003 | Torjussen | ................ | G06F 11/08 365/200 |
| 2004/0015758 A1 * | 1/2004 | Pathak | .................... | G11C 29/12 714/725 |
| 2006/0062327 A1 * | 3/2006 | Dally | ..................... | H04L 7/033 375/316 |
| 2013/0007564 A1 * | 1/2013 | Bedeschi | ............ | G06F 12/0223 714/763 |

(Continued)

OTHER PUBLICATIONS

Extended European Search Report from European Patent Application No. 22181891.7, dated Dec. 5, 2022, 14 pages.

*Primary Examiner* — Steve N Nguyen
(74) *Attorney, Agent, or Firm* — Foley & Lardner LLP

(57) ABSTRACT

A semiconductor chip with error detection and correction includes multiple pipes and each pipe is coupled to one or more ports on the semiconductor chip. The semiconductor chip further includes a state machine coupled to the pipes to generate a number of events consisting of read- and/or scan-type events associated with a plurality of storage elements. The state machine is implemented in hardware and can centrally detect and correct erroneous memory entries across the plurality of storage elements.

23 Claims, 11 Drawing Sheets

(56) References Cited

U.S. PATENT DOCUMENTS

| | | |
|---|---|---|
| 2015/0340103 A1 | 11/2015 | Chakraborty et al. |
| 2017/0133106 A1 | 5/2017 | Viswanathan et al. |
| 2018/0196711 A1* | 7/2018 | Noro .................. G06F 11/10 |
| 2019/0051370 A1 | 2/2019 | Azam et al. |
| 2020/0371862 A1* | 11/2020 | Thompson .......... G06F 11/1064 |

* cited by examiner

| | Value | Unit | Remarks |
|---|---|---|---|
| Failures in 0.2 Mbits TCAM (512x200) | 59.5 | FIT | |
| MTBF in 0.2 Mbits TCAM | 16806722.69 | Hours | |
| Failure Rate in 0.2 Mbits TCAM | 1.65278E-14 | per mSec | |
| Probability of having error in both Macro 0 and Macro 1 | 2.73167E-28 | | |
| MTBF of having error in both Macro 0 and Macro 1 | 1.16082E+17 | Years | This is much longer than even the age of the universe! |
| MTBF of having the exact same error in both the Macros on the exact same location | | | Almost Impossible! |

FIG. 5

EARLY ERROR DETECTION AND AUTOMATIC CORRECTION TECHNIQUES FOR STORAGE ELEMENTS TO IMPROVE RELIABILITY

TECHNICAL FIELD

The present description relates generally to semiconductor systems and, in particular, to early error detection and automatic correction techniques for storage elements with improved reliability in semiconductor systems.

BACKGROUND

In semiconductors, there are mostly two types of errors in storage elements, hard errors and soft errors. A hard error is an issue that results from a permanent physical flaw. A soft error is an issue that causes a temporary condition that alters stored data in an unintended way. Soft errors are caused by events rather than a persistent physical condition. Soft errors can occur on transmission lines, in digital logic, analog circuits, magnetic storage, and elsewhere, but are most commonly known in semiconductor storage, since erroneous data is persistent, leading to other unintended consequences for a much longer time. Soft error rate (SER) is the rate at which a device encounters soft errors. It is typically expressed as either the number of failures in time (FIT) or mean time between failures (MTBF). The FIT is the unit adopted for quantifying failures in time and is equivalent to one error per billion hours of device operation. MTBF is usually specified in years of device operation.

The soft error can be caused by ionizing radiation such as alpha particles, cosmic rays and thermal neutrons. Alpha particles may result from decay of traces of radioactive material in the packaging, and the cosmic rays on the Earth's surface consist of showers of energetic secondary particles such as fast neutrons, protons and pions that are created by the primary cosmic particles. Thermal neutrons result from fast neutrons losing their energy and coming to thermal equilibrium with their surroundings and can create charged particles such as alpha particles, gamma rays and Li nuclei that can cause a soft error in semiconductor storage. Soft errors can also be caused by random noise or signal integrity issues such as inductive or capacitive crosstalk. Traditionally, if detected, a soft error may be corrected by rewriting correct data in place of erroneous data. Systems may use error correction to correct soft errors on the fly using error correction codes (ECCs). However, in many systems, it may be impossible to determine the correct data, or even to discover that an error is present at all. In addition, before the detection or correction can occur, the system may have crashed, in which case the recovery procedure must include a reboot. Some characteristics of reliable systems may include, fault tolerance (FT), high availability (HA) and disaster recovery (DR). FT is about making individual components of a system resilient to failure, and no downtime is acceptable for a system component to be considered fault tolerant. HA pertains to making an entire system as a whole resilient to failure. Only a very small amount of downtime, e.g., 0.05% (i.e., 99.95% uptime) is acceptable for a system to be considered highly available. DR is about restoring a system that has gone down (regardless of whether it is considered HA), making sure that the HA uptime goal is met.

Macro storage elements (hereinafter, macros) are implemented in hardware, some specifics of which are described herein. Macros are instantiations of predesigned storage elements such as configuration memories that a logic designer can use in a chip design. Macros are designed at a transistor level and are therefore quite efficient in terms of chip area and power consumption. As an implementation scheme in macros, column multiplexing (C-Muxing) is used to make sure that adjacent bits in a logical entry are scattered in different (e.g., two) physical entries. This in turn makes sure that the extent of multiple bit upsets are limited to a small number, ideally only one. For example, for a logical entry with a single ECC across n bits, a physical macro with CMUX=1 enables storing even bits of the logical entry in a physical location 0 and odd bits of the logical entry in a physical location 1. This allows for a 2-bit upset to be detected and corrected and a 3-5-bit upset be detected but not corrected.

In a static random-access memory (SRAM) or register file (SRF) macro, when the macro is read, its data content with corresponding ECC is accessed and checked for errors. SRF macros typically have built-in C-Muxing. Therefore, if a soft error upsets multiple bits (e.g., 2 bits), the upset bits are not part of the same logical entry. Hence, a single ECC field spanning across the logical entry will correct the single-bit error in both logical entries. In other words, bit upsets in a logical entry only affect that particular logical entry.

For ternary content-addressable memories (TCAMs), however, the compare command does not read the content of the macro and simply outputs the match and index at which the match occurred. Hence the entry contents are not available during comparisons. The error detection would not happen until the TCAM locations are read explicitly and checked for an error. This makes the detection intervals much longer. There is no built-in C-Muxing support for TCAM macros. As such, when there are bit upsets in TCAMs, they not only affect that one location or several locations, but they also affect the entire priority decode rendering the complete macro instance not usable till the error is corrected. Because TCAMs are used for critical packet processing and forwarding functions, undetected errors can drop or even worse, misforward a large amount of traffic that has the potential to bring the entire network down.

In summary, TCAMs have a much higher probability of a significantly larger number of bit flips. The system will see the packet lost or even worse, misforwarded, till the errors are detected and then corrected, which usually takes tens of milliseconds even after detection, which itself may not happen until all the TCAM entries are scanned explicitly. This can be a major problem with TCAMs today in the networking industry.

BRIEF DESCRIPTION OF THE DRAWINGS

Certain features of the subject technology are set forth in the appended claims. However, for purposes of explanation, several embodiments of the subject technology are set forth in the following figures.

FIG. 5 is a table illustrating an example of a probability of having an error in both macros of CAD of FIG. 4.

DETAILED DESCRIPTION

Figure 1:
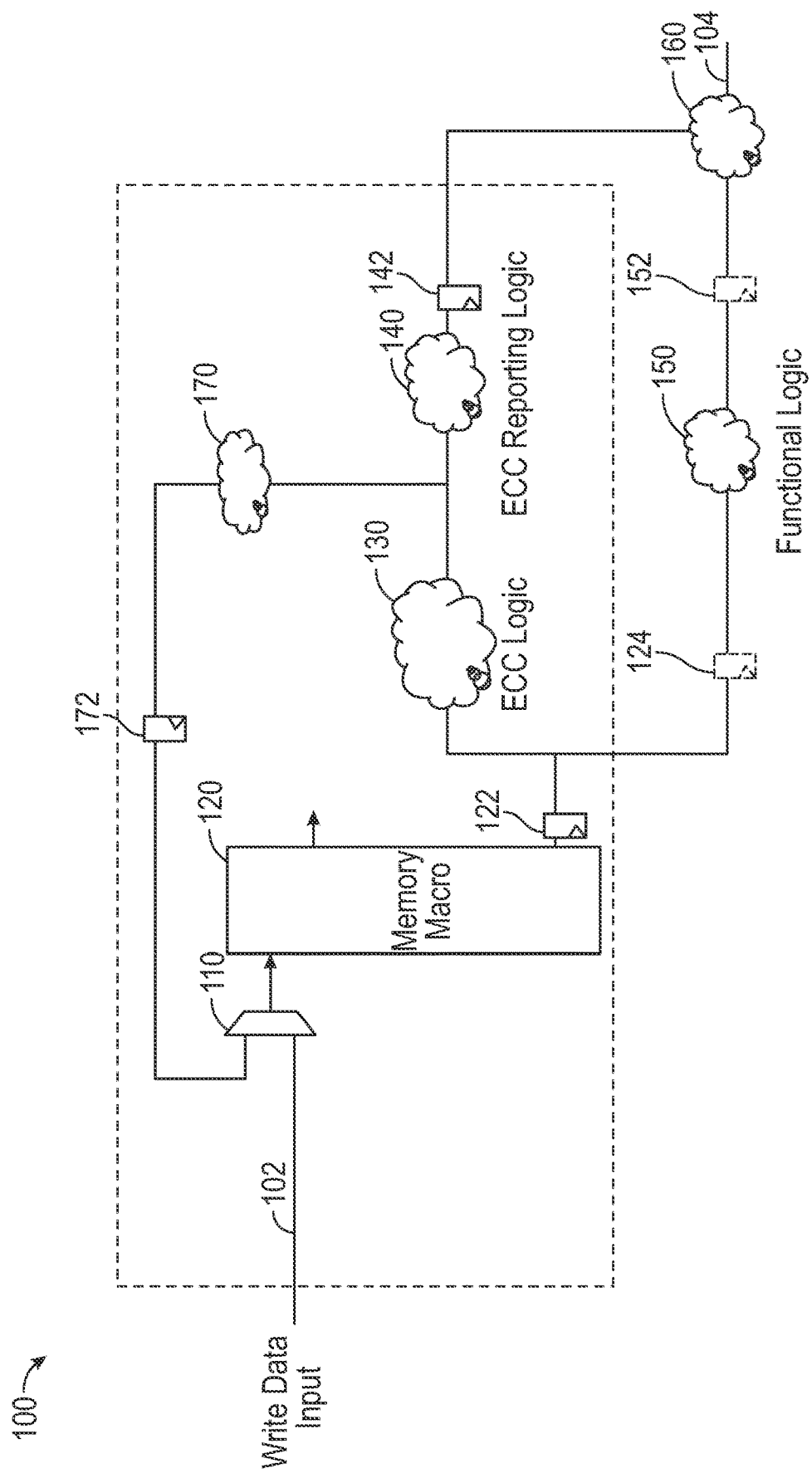
FIG. 1 is a block diagram illustrating an example of a macro instantiation architecture based on a latency efficient automatic correction (LEAN) scheme, according to various aspects of the subject technology.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology is directed to methods and systems for early error-detection and automatic-correction techniques for storage elements with improved reliability in semiconductor systems. The disclosed technology is based on a latency-efficient automatic correction (LEAN) scheme, which generally focuses on reliability aspects and, particularly, on early error detection for all of the config memories such as static random-access memory (SRAM) or static register file (SRF) and TCAMs. The subject technology also focuses on automatic error correction, without software (S/W) intervention for all the config memories such as SRAM, SRF and TCAM, and on optimizing hardware (H/W) logic and latency for error detection and correction for the config memories such as SRAM and SRF.

The LEAN and compare and detect (CAD) schemes are capable of detecting any number of bit upsets in a matter of nanoseconds in all kinds of semiconductor storage elements including SRAM, SRF and TCAM storage elements. The LEAN and CAD-correction (CAD-C) schemes are capable of automatically correcting the errors without requiring any S/W intervention within tens of nanoseconds, even with a full (100%) traffic load. The CAD scheme is capable of detecting any number of bit upsets without any redundant parity and/or error-correction code (ECC) bits or logic, thus saving cost. The CAD-C scheme is capable of automatically correcting any number of bit upsets without the need for expensive ECC bits and logic. The LEAN and CAD-C schemes optimize the critical packet path latency together with a chip area and power, for example, by eliminating column mixing in macros. The critical path can be determined by using a timing simulation of the chip circuitry.

The column muxing in macros can be eliminated, saving chip area and power consumption as well as achieving favorable aspect ratios to help eliminate congestion and for better timing in a physical design. An auxiliary state machine is provided to access the macros periodically with configurable time interval. In this respect, it is important to note the following facts. The error in a given macro may not be detected unless accessed by packets or by a central processing unit (CPU); the packets do not read TCAMs; and even worse, if this period is too long and errors are not detected and corrected in a timely fashion, correctable bit upsets in macros may turn into even undetectable error due to more bit upsets than the implemented mechanism can handle. The subject technology provides a configurable method to drop all the packets hitting detected erroneous entries as soon as they are detected until they are corrected, even in TCAMs, so that the traffic is not misforwarded.

FIG. 1 is a block diagram illustrating an example of a macro instantiation architecture 100 based on a LEAN scheme, according to various aspects of the subject technology. The macro instantiation architecture 100 includes a multiplexer (Mux) 110, a memory macro 120, an ECC logic 130, an ECC reporting logic 140, a functional logic 150, a logic 160, a corrected entry buffer logic 170 and a number of flops including flops 122, 142, 172 and optional flops 124 and 152. The macro instantiation architecture 100 provides the ECC logic 130 and the ECC reporting logic 140 parallel to the functional logic 150. This an important feature of the disclosed technology, which is different from the existing approach in that the ECC logic and reporting is in series with the functional logic. The write data input 102 is fed through the Mux 110 to be written to the memory macro 120, which is an instantiation of a predesigned memory (e.g., a RAM, SRF, TCAM) used in a router or a switch chip (e.g., a semiconductor chip). In some implementations, the memory macro 120 may store tables, for example, ingress and digress address tables of a router or a switch.

The functional logic 150 include electronic circuitry capable of performing the functionalities of the chip (e.g., router or switch). The ECC logic 130 includes logic circuitry and is responsible for error detection and correction. The ECC reporting logic 140 includes logic circuitry for reporting the error correction to the logic 160. The correction from the ECC logic 130 is provided through the corrected entry buffer logic 170 to the flop 172, which is a corrected entry buffer (cor_entry_buf) and is used to compensate for packet delivery-rate (PDR) macro latency increase. The correction is then sent to the memory macro 120 via the Mux 110. The flops 122 and the optional flops 124 and 152 function as delays and can compensate for latencies. In some implementations, a temporary cache is used to store a corrected entry following correction by the ECC logic and to provide corrected data in response to read operations from a cache while the corrected data waits to be written back to the memory macro 120.

Figures 2, 3:
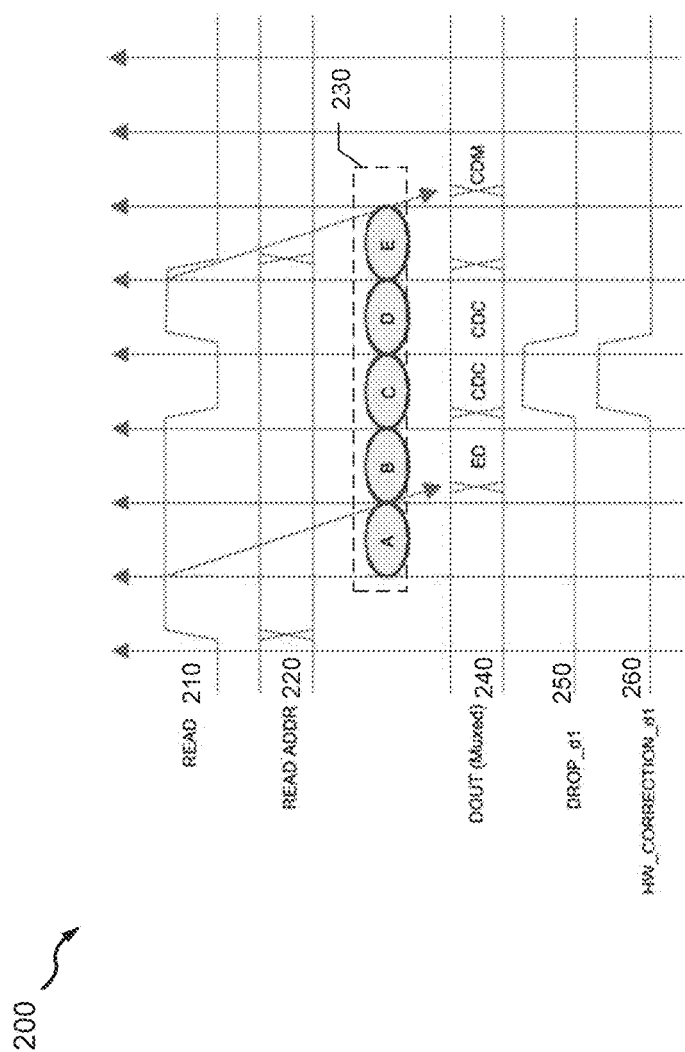
FIG. 2 is a timing diagram illustrating an example of a flow of events in the LEAN scheme of FIG. 1, according to various aspects of the subject technology.
FIG. 3 is a table illustrating examples of bit upsets in ternary content-addressable memory (TCAM).

FIG. 2 is a timing diagram 200 illustrating an example of the flow of events in the LEAN scheme of FIG. 1, according to various aspects of the subject technology. As seen from the timing diagram 200, read commands 210 are received during clock cycles that a read address 220 is active. A cluster of events 230 including events A, B, C, and D occur within the clock cycles that the read address 220 is active. During event A, the read data from the memory (e.g., memory macro 120 of FIG. 1) is available. During the event, externally flopped memory data is available, ECC is checked and one-bit error-corrected data is available. During event C, flopped error reporting together with enabled cor_entry_buf (e.g., flop 172 of FIG. 1) is available, and the cor_entry_buf is ready to be written back into memory on the bubble. During event D, cor_entry_buf is unavailable because it is already written back to the memory. The output data (DOUT) 240 includes error data (ED), corrected data from cor_entry_buf (CDC), which are available during the events B, C and D, and corrected data directly from memory (CDM), which becomes available after the E event.

FIG. 3 is a table 300 illustrating examples of bit upsets in TCAM. The probability of error in a logical entry for a memory implemented by 7-nm technology is shown both for SRAM and TCAM. The error is shown as the number of bit upsets, where a bit of data is changed from zero to one or vice versa. For example, for SRAM and TCAM the probabilities of 2-bit upset error are 19.75% and 19.72%, respectively, which are almost the same. For higher bit-upset errors the probabilities for SRAM and TCAM differ more. Even higher probability of five and more bit flips in TCAMs is observed in 5-nm technology. It is noted that TCAMs do not have native column muxing and the cost of error correction increases for any solution, which emulates column muxing by duplicating the parity and/or ECC bits per logical entry.

Figure 4:
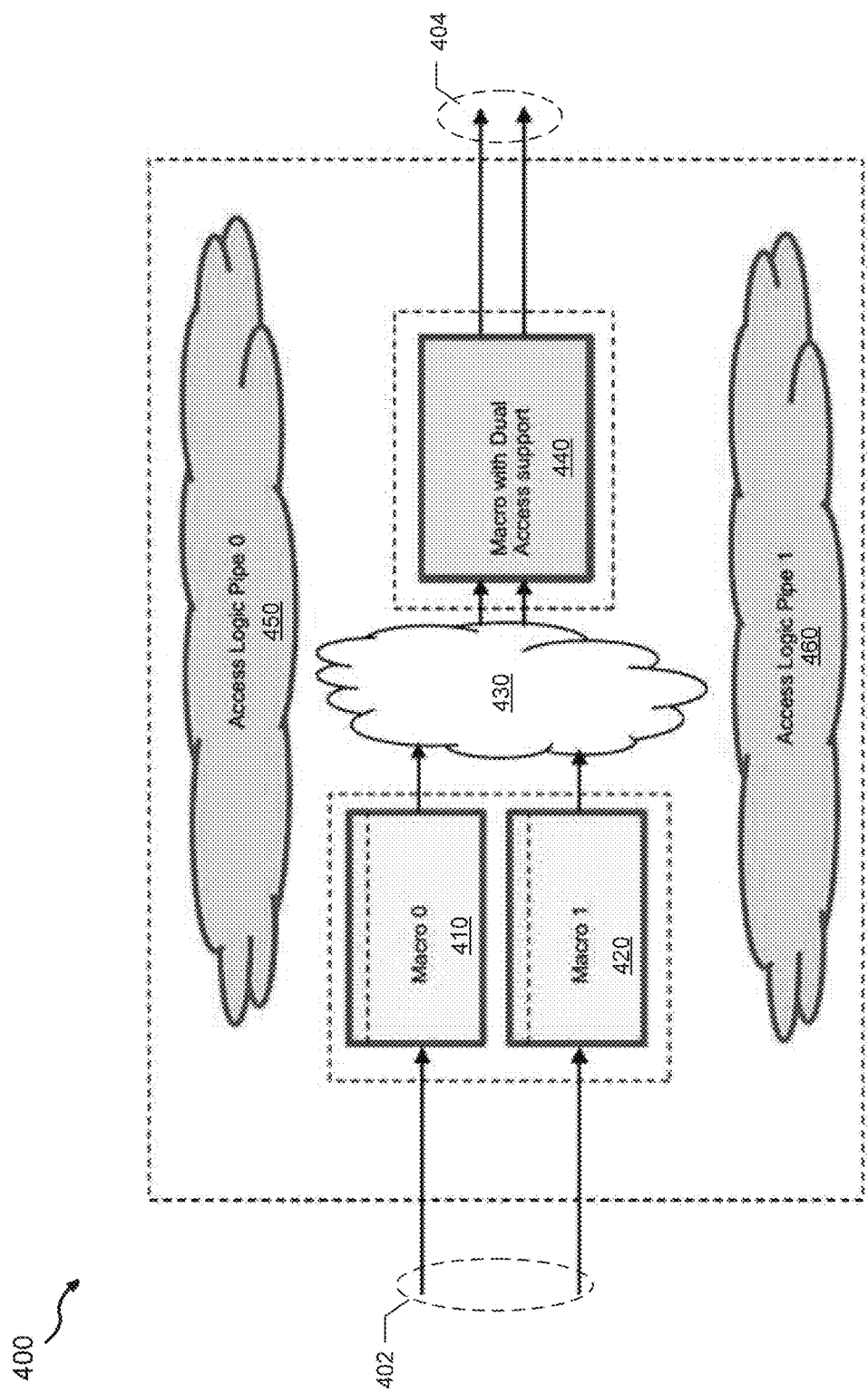
FIG. 4 is a block diagram illustrating an example of a typical compare and detect (CAD) architecture, in accordance with some aspects of the subject technology.

FIG. 4 is a block diagram illustrating an example of a typical compare-and-detect (CAD) architecture 400, in accordance with some aspects of the subject technology. In a single packet processing pipe (hereinafter, pipe) the upper limit on the bandwidth is mainly governed by the given technology. When the total supported bandwidth of a chip requires more than a single pipe, multiple packet-processing pipes are used on that chip. Therefore, inevitably, there are copies of the config memories (SRM, SRF and TCAMs) with the same data on the chip for different pipes. Because TCAMs do not support dual-compare like dual-reads that are available on SRAM and SRFs, TCAMs have even more copies of the same data as they cannot be shared across two pipes as in SRAMs and SRFs.

The subject technology supports CAD, which compares the content of corresponding locations across the copies, on read/scan events, to detect errors. The CAD architecture 400 includes macros 410 (Macro and 420 (Macro 2), logic circuitry 430, a macro 440 with dual access support, an access logic pipe 450 (Pipe 0) and an access logic pipe 460 (Pipe 1). In some implementations the macros 410 and 420 can be TCAMs, and the macro 440 can be SRAM or SRF. The input data packets 402 are read by the macros 410 and 420 and the logic circuitry 430 compares the content of corresponding locations within macros 410 and 420 across the copies, on read/scan events, to detect errors. It should be noted that the macros 410 and 420 (TCAMs) are not exposed separately in a register file. There is only one logical instance per pipe (e.g., access logic pipe 450 or access logic pipe 460), so the contents on all of the locations of the macros 410 and 420 (TCAMs) are always the same, except when there is an error, which will be detected by the logic circuitry 430. If there is a mismatch, on any location across the macros 410 and 420, the location is detected as erroneous. Therefore, no redundant bits (parity/ECC) are required for error detection. It should be noted that it is extremely improbable to have errors in both macros 410 and 420 (TCAMs) at the same time. As will be discussed below, it is almost impossible to have the exact same error, across the same location, in the macros 410 and 420 (TCAMs). The macros 440 may include associated data, which are used to provide output data 404. Typical TCAM stores a key to be compared and the corresponding location in associated data stores. This action is taken if a match is indicated by the TCAM. For example, when a 5-tuple data (e.g., Source/Destination IP addresses, Source/Destination Port and Protocol fields) is stored in TCAM, actions such as "forward the packet to a certain destination", "copy the packet to the CPU" and/or "drop the packet" are stored in the associated data.

FIG. 5 is a table 500 illustrating an example of a probability of having an error in both macros of CAD of FIG. 4. Table 500 is self-explanatory and indicated that while mean time between failures (MTBF) for a 0.2 Mbits TCAM (512×200) is about 16806723 hours the MTBF for having errors in both macros 410 and 420 of FIG. 4 are about 1.16 E+17 years, which is much longer than even the age of the universe. Furthermore, the MTBF of having the exact same error in both macros 410 and 420 on the exact same location is almost impossible.

Figure 6:
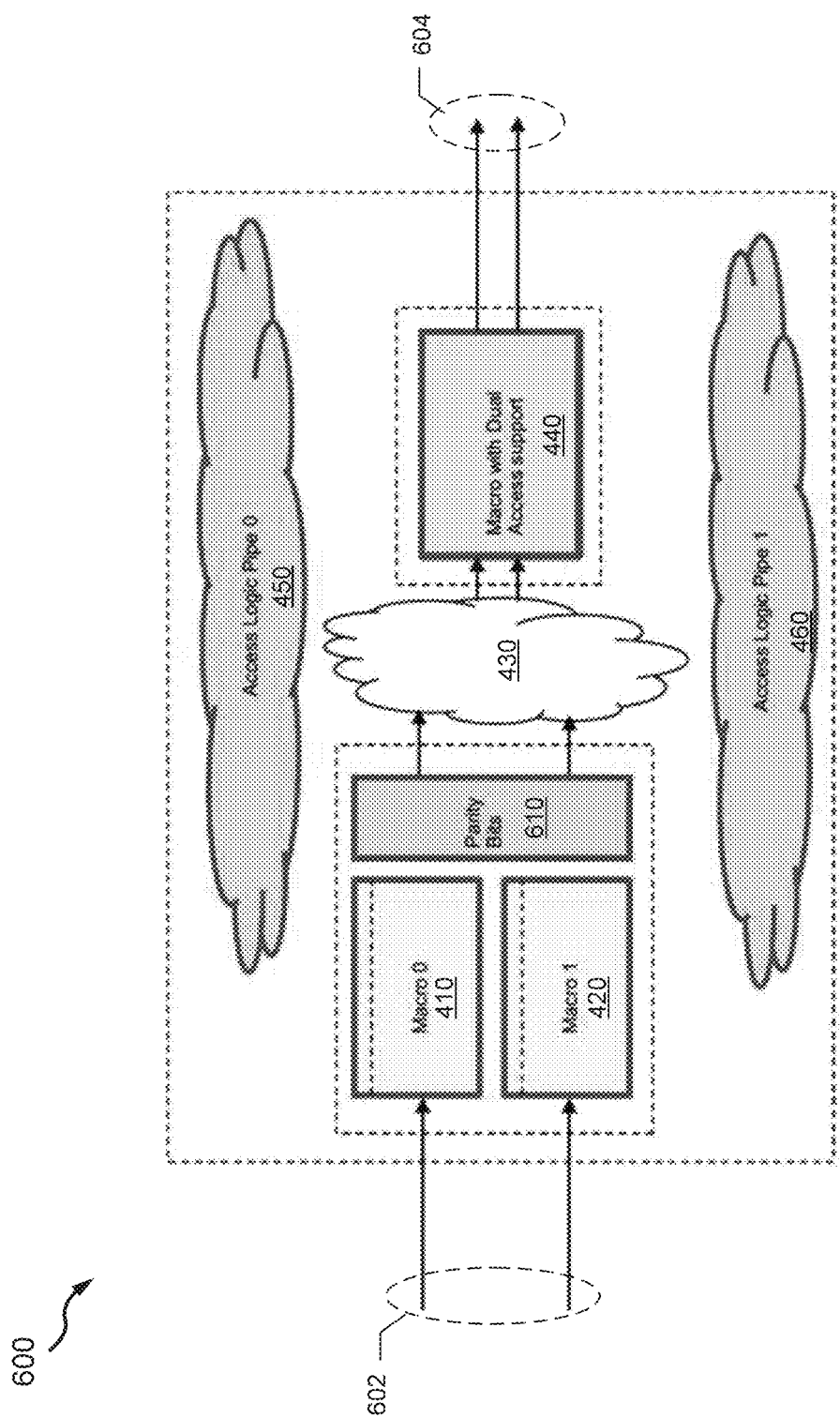
FIG. 6 is a block diagram illustrating an example of a CAD plus correct architecture, in accordance with some aspects of the subject technology.

FIG. 6 is a block diagram illustrating an example of a CAD plus correct architecture 600, in accordance with some aspects of the subject technology. The CAD plus correct architecture 600 is similar to the CAD architecture 400 of FIG. 4 except for the addition of a parity-bit block 610 before the logic circuitry 430. The content of both macros 410 and 420 are configured by S/W to be the same. The parity-bit block 610 is implemented to know which entry has an error, so that the other good entry can be used to correct the erroneous entry. With multiple P parity bits within parity-bit block 610, each covering non-adjacent bits in a location, up to (2×P−1) contiguous bit flips can be detected. For example, if the parity-bit block 610 is implemented with P=4, it can detect up to seven (=2×4−1) contiguous bit flips for auto-correction, which is guaranteed within tens of nanoseconds. If not auto correctable (beyond supported number of contiguous bit flips for a given chip), the error can still be indicated to S/W as uncorrectable by H/W, so that S/W can correct it using an existing error correction mechanism.

In summary, the CAD is the least expensive technique and provides full detection capability (any number of bit flips in logical entries) without any redundant bits such as ECC and/or parity or corresponding logic. The CAD can be implemented for any and all configuration memories with multiple copies across pipes. Using CAD, column muxing can be totally removed from all the macros, thus significantly saving chip area and power consumption.

When CAD is used, redundant ECC bits and logic for the config tables are not required. This is beneficial for the chip area, power and latency savings. Only a parity bit (only one instead of many in case of ECC bits) and logic (much simpler that ECC) is required if auto correction is desired.

Figure 7A:
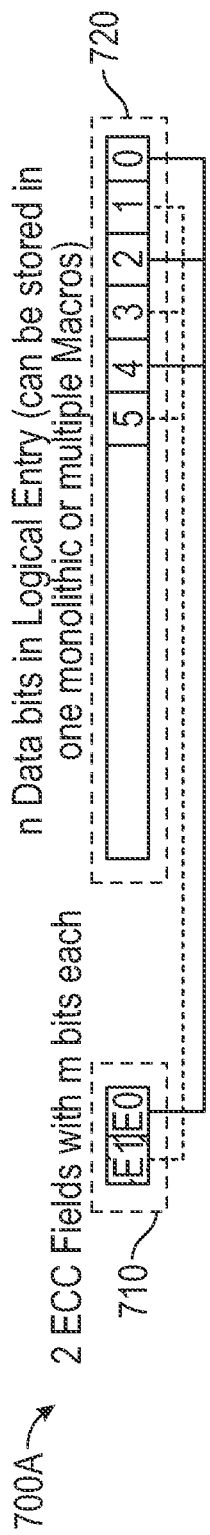
FIG. 7A is a diagram illustrating an example of a column muxing outside of the macros with multiple error correction codes (ECCs) fields, in accordance with some aspects of the subject technology.

FIG. 7A is a diagram illustrating an example of column muxing scheme 700A outside of macros with multiple ECC fields, in accordance with some aspects of the subject technology. In general, macros implement column muxing where adjacent bits in logical entries are stored in different physical entries. This implementation has significant overhead, especially for smaller macros. The column muxing can be implemented outside of macros to achieve better aspect ratio of macros (tall and narrow macros block the horizontal routes causing congestion in floorplans), reduced area, reduced power, better timing on ECC implementation and significantly wider macro meeting a given timing specification, which can reduce the macro instance count, in turn reducing macro, design for testing (DFT) and overhead area on the chip.

When it is imperative for a given application, enough ECC fields can be implemented for column muxing, to reduce the probability of uncorrectable errors. This can result in having a failures-in-time (FIT) of almost zero or a long MTBE. As an example, if a given technology has a maximum of 7-bits upsets, then the probability of uncorrectable errors can be reduced by implementing column muxing outside of macros with multiple ECC fields, interleaving of ECC bits while storing in a macro, as discussed below.

In the example column muxing scheme 700A, which implements column muxing outside of macros with multiple ECC fields, ECC fields 710 consist of ECC fields E0 and E1 each with m bits, and data fields 720 include data bits in the logical entry. As shown, the ECC field E0 only considers even bits (0, 2, 4, etc.) of the data bits, and the ECC field E1 only considers odd bits (1, 3, 5, etc.) for ECC calculations. Thus, any two-bit flips can affect different ECC fields, emulating column muxing. It is noted that ECC bits themselves need to be interleaved while storing in the macro to make sure that no logically contiguous ECC bits are physically adjacent to each other in the macro. Using the column muxing scheme 700A, up to two-bit flips can be detected and corrected; three-to-five-bit flips can only be detected and not corrected; and six-or-more-bit flips cannot be detected.

Figure 7B:
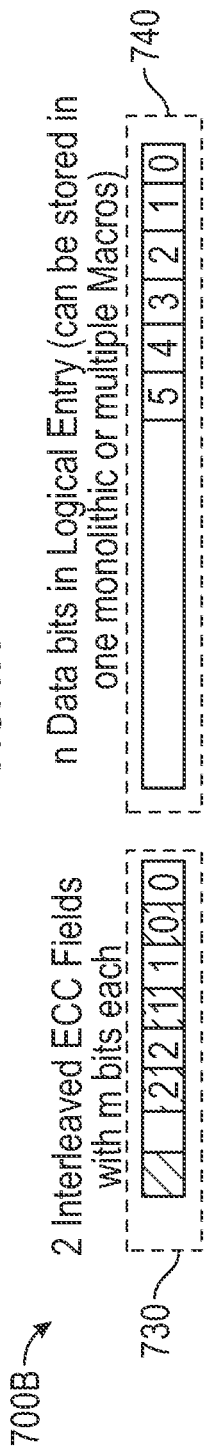
FIG. 7B is a diagram illustrating an example of the interleaving of ECC bits while storing in a macro, in accordance with some aspects of the subject technology

FIG. 7B is a diagram illustrating an example of an interleaving scheme 700B of ECC bits while storing in a macro, in accordance with some aspects of the subject technology. In the interleaving scheme 700B, an ECC field 730 includes interleaved ECC fields each having m bits, and a data field 740 includes n data bits in logical entry, which can be stored on one monolithic macro or multiple macros. In some implementations, data bits can also be optionally interleaved along with the ECC bits while storing in macros.

Figure 7C:
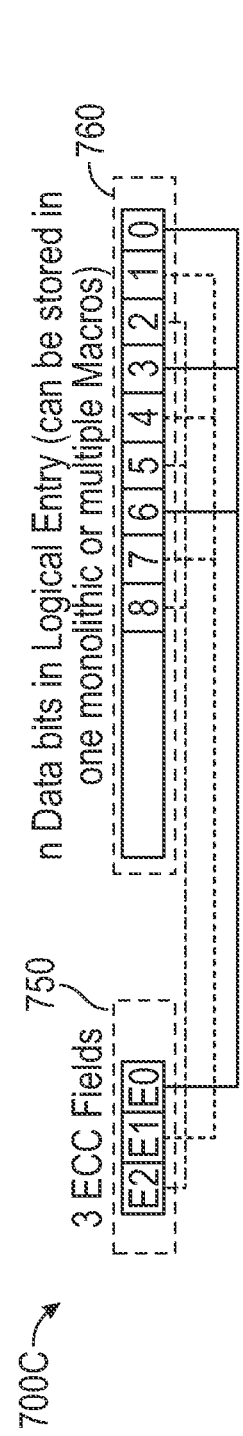
FIG. 7C is a diagram illustrating an example of a column muxing outside of the macros with multiple ECCs fields and a corresponding table, in accordance with some aspects of the subject technology.

FIG. 7C is a diagram illustrating an example of a column muxing outside of macros scheme 700C with ECC fields and a corresponding table 770, in accordance with some aspects of the subject technology. ECC fields 750 consist of ECC fields E0, E1 and E2, each with m bits, and data fields 760 include data bits in the logical entry, which can be stored in one monolithic macro or multiple macros. As shown, the ECC field. E0 only considers bits (0, 3, 6, etc.) of the data bits, the ECC field E1 only considers bits (1, 4, 7, etc.) for ECC calculations, and the ECC field E2 only considers hits (2, 5, 8, etc.) for ECC calculations.

As shown in table 770, using the column muxing, outside of macros scheme 700C, one- to three-bit flips can be detected and corrected; four- to eight-bit flips can only be detected and not corrected; and nine- or more bit flips cannot even be detected.

Figure 8:
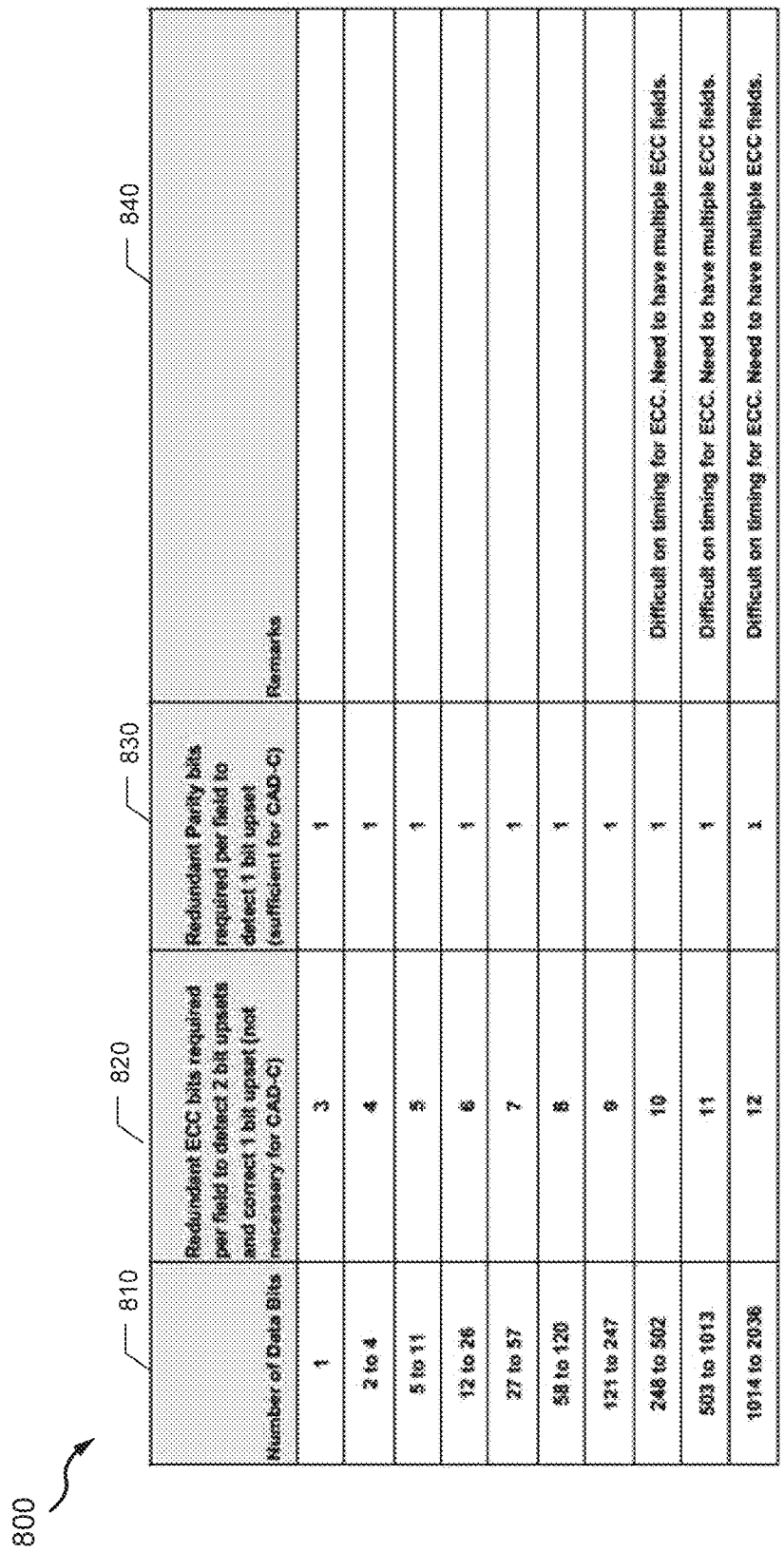
FIG. 8 is a table illustrating an example of required ECC bits and redundant parity bits for a different number of data bits.
Figure 9:
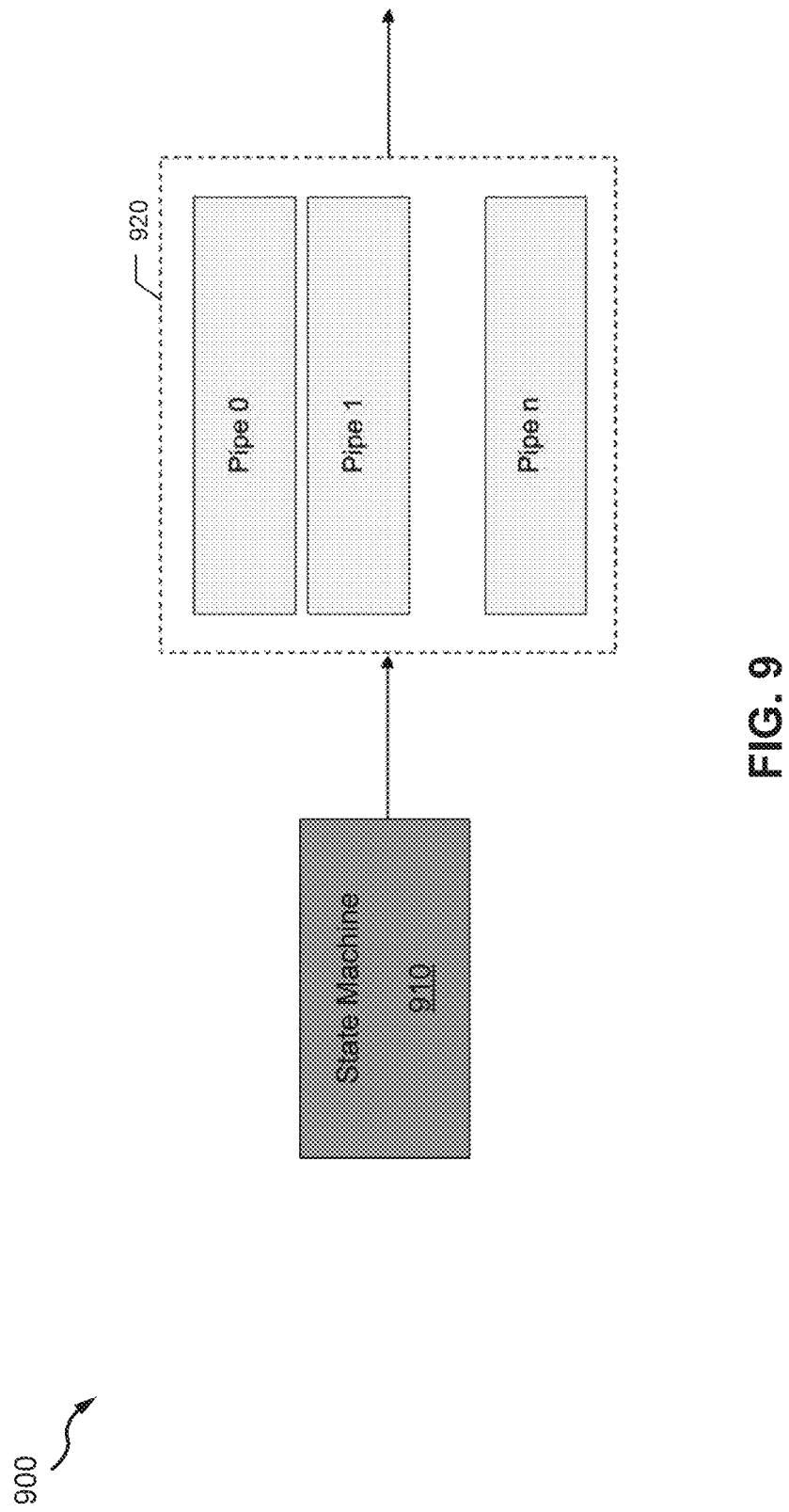
FIG. 9 is a diagram illustrating an example of a centralized state machine to read pipe entries.

FIG. 8 is a table 800 illustrating an example of required ECC bits and redundant parity bits for different numbers of data bits. Table 800 includes four columns 810, 820, 830 and 840. The column 810 shows the number of data bits. The column 820 shows the corresponding number of redundant ECC bits required per field to detect two-bit upsets and correct a one-bit upset. The column 830 indicates the corresponding number of redundant parity bits required per field to detect one-bit upsets, and the column 840 includes remarks, which are self-explanatory. FIG. 9 is a diagram illustrating an example of a centralized state machine 910 to read pipes 920 entries. The state machine 910 can trigger periodic read and/or scan events, for example, with configurable intervals between read and/or scan events, for configuration memory (e.g., SRAM, SRF, TCAM) entries to facilitate detection and/or correction of errors. This is in addition to packet and CPU rad accesses. It should be noted that packets are the predominant number of events for configuration memories, and packet events do not read the TCAM entries. The pipes 920 are packet processing pipes and include a number (n) of pipes (Pipe 0, Pipe 1 . . . . Pipe n). Each pipe may include suitable logic and/or circuitry and configuration memories that are centrally read and/or scanned for detection and correction of errors. The state machine facilitates detection and/or correction of errors by implementing one or more aspects of the subject technology, as discussed above, such as the LEAN, CAD and CAD-C schemes, without any S/W intervention. In some implementations, the state machine 910 includes LEAN. CAD and CAD-C architectures for implementing the LEAN, CAD and CAD-C schemes, respectively. For example, the LEAN architecture can include ECC logic and ECC reporting logic implemented in parallel with functional logic and a logic implementation to separate out ECC checking from the main logic path to reduce timing and latency. In one or more implementations, the state machine 910 implements the CAD scheme by comparing content of corresponding locations across copies of storage elements within the pipes and can detect any number of bit upsets without redundant parity and/or ECC bits or logic to save cost. In some implementations, the state machine 910 can implement the CAD scheme to compare duplicate entries (duplicate copies of the same data entry) within the entirety of the configuration memories on the semiconductor chip to detect errors without requiring ECC bits and ECC logic. In one or more implementations, the state machine 910 can implement the CAD-C scheme to identify an erroneous entry among duplicate entries and to automatically correct the erroneous entry without requiring software intervention or ECC logic to identify and correct the erroneous entry.

Figure 10:
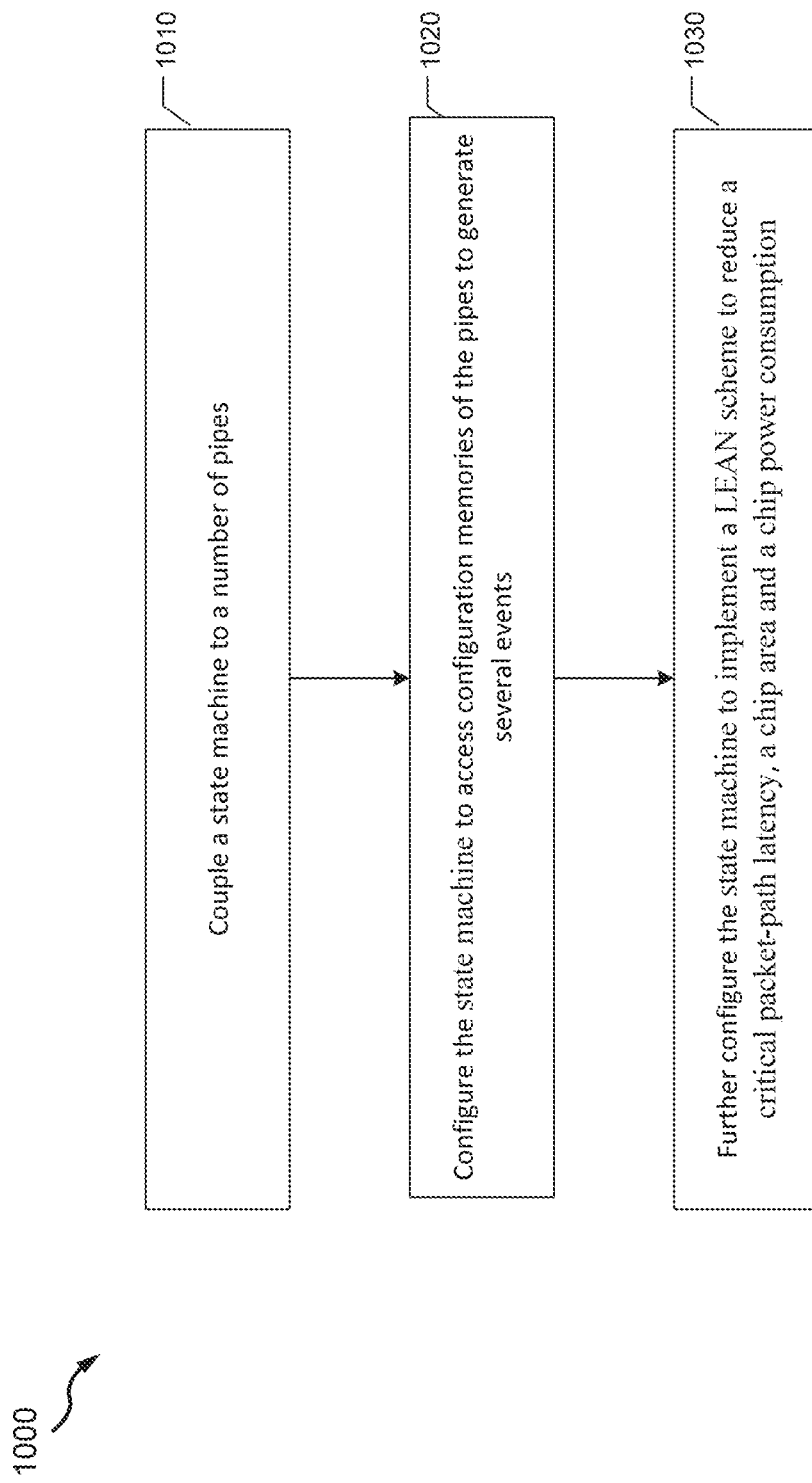
FIG. 10 is a flow diagram illustrating an example of a method of error detection and correction, in accordance with some aspects of the subject technology.

FIG. 10 is a flow diagram illustrating an example of a method 1000 of error detection and correction, in accordance with some aspects of the subject technology. The method 1000 includes coupling a state machine (e.g., 910 of FIG. 9) to a number of pipes (e.g., 920 of FIG. 9) (1010) and configuring the state machine to access configuration memories (e.g., 120 of FIG. 1) of the pipes to generate several events (1020). The method 1000 further includes configuring the state machine to implement a LEAN scheme (as shown in FIG. 1) to reduce a critical packet-path latency, a chip area and a chip power consumption (1030). The pipes are packet processing pipes, and the events are one of read-or scan-type events of the configuration memories, during which the configuration memories are read or scanned, respectively.

Figure 11:
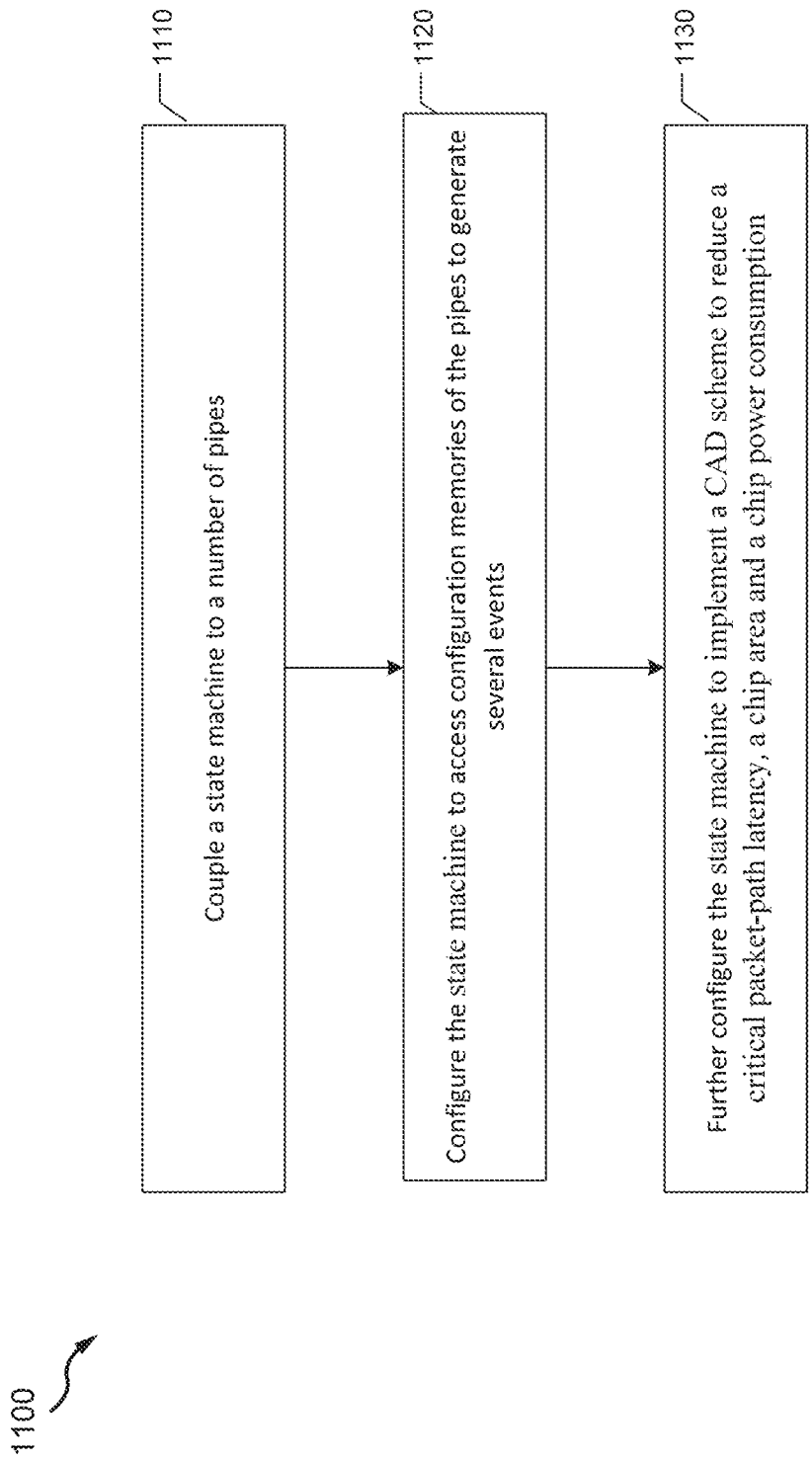
FIG. 11 is a flow diagram illustrating an example of a method of error detection and correction, in accordance with some aspects of the subject technology.

FIG. 11 is a flow diagram illustrating an example of a method 1100 of error detection and correction, in accordance with some aspects of the subject technology. The method. 1100 includes coupling a state machine (e.g., 910 of FIG. 9) to a number of pipes (e.g., 450 and 460 of FIG. 4) (1110) and configuring the state machine to access configuration memories (e.g., 410 and 420 of FIG. 4) of the pipes to generate several events (1120). The method 1000 further includes configuring the state machine to implement a CAD scheme (as shown in FIG. 4) to reduce a critical packet-path latency, a chip area and a chip power consumption (1130). The pipes are packet processing pipes, and the events are one of read- or scan-type events of the configuration memories.

Figure 12:
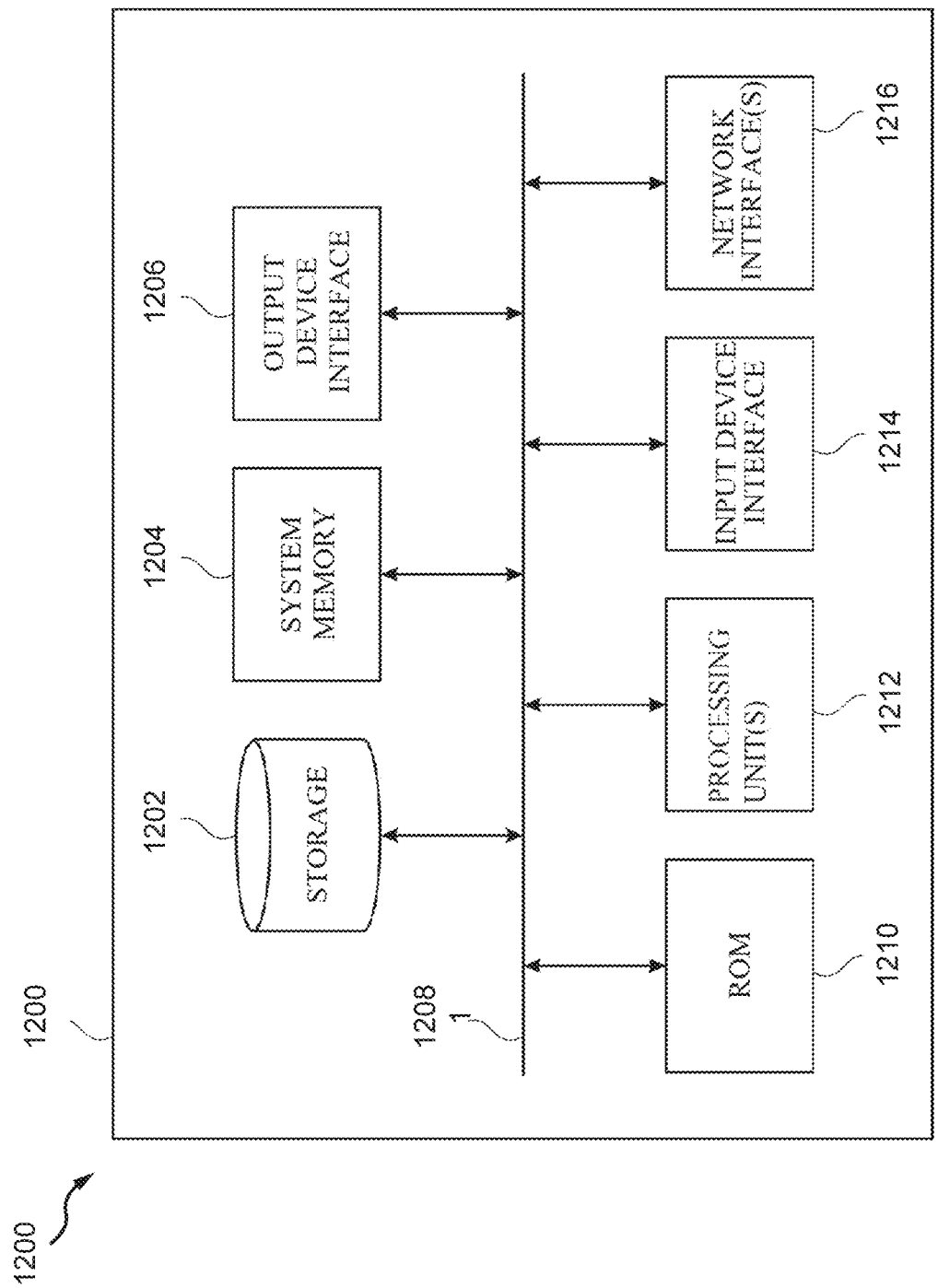
FIG. 12 is an electronic system within which some aspects of the subject technology are implemented.

FIG. 12 is an electronic system within which some aspects of the subject technology are implemented. The electronic system 1200 can be, and/or can be a part of, the network switch or router of a data center or an enterprise network. The electronic system 1200 may include various types of computer-readable media and interfaces for various other types of computer-readable media. The electronic system 1200 includes a bus 1208, one or more processing unit(s) 1212, a system memory 1204 (and/or buffer), a ROM 1210, a permanent storage device 1202, an input device interface 1214, an output device interface 1206, and one or more network interfaces 1216, or subsets and variations thereof.

The bus 1208 collectively represents all system, peripheral, and chipset buses that communicatively connect the numerous internal devices of the electronic system 1200. In one or more implementations, the bus 1208 communicatively connects the one or more processing unit(s) 1212 with the ROM 1210, the system memory 1204, and the permanent storage device 1202. From these various memory units, the one or more processing unit(s) 1212 retrieve instructions to execute and data to process in order to execute the processes of the subject disclosure. The one or more processing unit(s) 1212 can be a single processor or a multi-core processor in different implementations. In one or more aspects, the one or more processing unit(s) 1212 may be used to implement the state machine 910 of FIG. 9 and/or to implement the methods of FIGS. 10 and 11.

The ROM 1210 stores static data and instructions that are needed by the one or more processing unit(s) 1212 and other modules of the electronic system 1200. The permanent storage device 1202, on the other hand, may be a read-and-write memory device. The permanent storage device 1202 may be a non-volatile memory unit that stores instructions and data even when the electronic system 1200 is off. In one or more implementations, a mass-storage device (such as a magnetic or optical disk and its corresponding disk drive) retry be used as the permanent storage device 1202.

In one or more implementations, a removable storage device (such as a floppy disk, flash drive, and its corresponding disk drive) may be used as the permanent storage device 1202. Like the permanent storage device 1202, the system memory 1204 may be a read-and-write memory device. However, unlike the permanent storage device 1202, the system memory 1204 may be a volatile read-and-write memory, such as random-access memory (RAM). The system memory 1204 may store any of the instructions and data that one or more processing unit(s) 1212 may need at runtime. In one or more implementations, the processes of the subject disclosure are stored in the system memory 1204, the permanent storage device 1202, and/or the ROM 1210. From these various memory units, the one or more processing unit(s) 1212 retrieve instructions to execute and data to process in order to execute the processes of one or more implementations. In one or more aspects, the storage unit 1202 may represent the storage elements within the pipes 920 of FIG. 2 and macros 120 of FIG. 1 or 410 and 420 of FIG. 4.

The bus 1208 also connects to the input and output device interfaces 1214 and 1206. The input device interface 1214 enables a user to communicate information and select commands to the electronic system 1200. Input devices that may be used with the input device interface 1214 may include, for example, alphanumeric keyboards and pointing devices (also called "cursor control devices"). The output device interface 1206 may enable, for example, the display of images generated by electronic system 1200. Output devices that may be used with the output device interface 1206 may include, for example, printers and display devices, such as a liquid-crystal display (LCD), a light-emitting diode (LED) display, an organic light-emitting diode (OLED) display, a flexible display, a flat panel display, a solid-state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 12, the bus 1208 also couples the electronic system 1200 to one or more networks and/or to one or more network nodes, through the one or more network interface(s) 1216. In this manner, the electronic system 1200 can be a part of a network of computers (such as a local area network (LAN), a wide area network (WAN), an Intranet, or a network of networks, such as the Internet). Any or all components of the electronic system 1200 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general-purpose or special-purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself or on a distributed storage system such as a storage network.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software/hardware product or packaged into multiple software/hardware products.

As used in this specification and any claims of this application, the terms "base station," "receiver," "computer," "server," "processor," and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item), The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one," unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A system including error detection and correction, the system comprising:
    a plurality of pipes, each pipe being coupled to one or more ports on a semiconductor chip and including configuration memories; and
    a state machine coupled to the plurality of pipes and configured to access the configuration memories to generate a plurality of events with configurable intervals between each of the plurality of events,
    wherein:

the plurality of events comprise one of read- or scan-type events of the configuration memories, and the state machine is implemented in hardware and is configured to detect and correct errors including erroneous memory entries across the configuration memories.

2. The system of claim 1, wherein the plurality of storage elements are embedded in the plurality of pipes, and wherein the errors comprise bit-upset errors within the plurality of storage elements of the plurality of pipes.

3. The system of claim 2, wherein the state machine is configured to drop packets arriving at detected erroneous memory entries until the erroneous memory entries are corrected in order to help prevent traffic from being misforwarded.

4. The system of claim 1, wherein the plurality of events comprise periodic events having configurable time intervals.

5. The system of claim 1, wherein the storage elements comprise configuration memories including one or more of static random-access memory (SRAM), a register file (SRF), or a ternary content-addressable memory (TCAM).

6. The system of claim 1, wherein the state machine is configured to:
detect and correct errors by implementing a latency-efficient automatic correction (LEAN) scheme; and
initiate periodic scans with configurable intervals to trigger read operations to check for errors.

7. The system of claim 6, wherein the state machine is configured to implement the LEAN scheme to reduce at least two of a critical packet-path latency, a chip area and a chip power consumption.

8. The system of claim 7, wherein the state machine is configured to implement the LEAN scheme without column muxing of configuration memories to reduce at least two of the critical packet-path latency, the chip area and the chip power consumption.

9. The system of claim 7, wherein the LEAN scheme comprises:
error-correction code (ECC) logic and ECC reporting logic implemented in parallel with functional logic; and
a logic implementation configured to separate out ECC checking from a main logic path to reduce timing and latency.

10. The system of claim 9, wherein the LEAN architecture further comprises:
logic configured to implement the LEAN scheme by writing back a correct entry into storage elements of the plurality of pipes, wherein the LEAN scheme is configured to correct errors automatically without requiring software intervention within less than 100 nanoseconds even with 100% traffic load;
a temporary cache configured to store a corrected entry following a correction by the ECC logic and to provide corrected data in response to read operations from a cache while the corrected data waits to be written back to a macro.

11. The system of claim 1, wherein the state machine is configured to detect errors by implementing a compare-and-detect (CAD) scheme without column muxing of configuration memories to reduce at least two of a critical packet-path latency, a chip area and a chip power consumption.

12. The system of claim 11, wherein the state machine is configured to implement the CAD scheme by comparing content of corresponding locations across copies of storage elements within the plurality of pipes, and wherein the CAD scheme is configured to detect bit upsets without using parity and/or ECC bits or ECC logic to save cost.

13. The system of claim 12, wherein the state machine is configured to implement a CAD-correction (CAD-C) scheme by further using a parity-bit block configured to facilitate error detection to help prevent content containing an error from being used.

14. The system of claim 13, wherein the state machine is configured to implement the CAD-C scheme to correct bit-upset errors without requiring the ECC bits and the ECC logic.

15. The system of claim 13, wherein the state machine is configured to implement the CAD scheme to compare duplicate copies of data entries to detect errors without requiring the ECC bits and the ECC logic.

16. The system of claim 13, wherein the state machine is configured to implement the CAD-C scheme to identify an erroneous entry among duplicate copies of data entries and to correct the erroneous entry without requiring software intervention or the ECC logic.

17. A method of error detection and correction, the method comprising:
coupling a state machine to a plurality of pipes, the plurality of pipes comprising configuration memories; and
configuring the state machine to:
access the configuration memories of the plurality of pipes to generate a plurality of events with configurable intervals between each of the plurality of events; and
implement a latency efficient automatic correction (LEAN) scheme to reduce at least two of a critical packet-path latency, a chip area and a chip power consumption,
wherein:
the plurality of events comprise one of read-or scan-type events of the configuration memories.

18. The method of claim 17, further comprising implementing the LEAN scheme by providing ECC logic and ECC reporting logic in parallel to a functional logic; and writing back a correct entry into the configuration memories.

19. The method of claim 18, further comprising configuring the state machine to reduce at least two of the critical packet-path latency, the chip area, and the chip power consumption without column muxing of configuration memories.

20. A method of error detection and correction, the method comprising:
coupling a state machine to a plurality of pipes the plurality of pipes comprising configuration memories; and
configuring the state machine to:
access the configuration memories of the plurality of pipes to generate a plurality of events with configurable intervals between each of the plurality of events; and
implement a compare and detect (CAD) scheme to reduce at least two of a critical packet-path latency, a chip area and a chip power consumption,
wherein:
the plurality of events comprise one of read- or scan-type events of the configuration memories.

21. The method of claim 20, wherein the at least two of the critical packet-path latency, the chip area and the chip power consumption are reduced by removing a requirement for column muxing of configuration memories.

22. The method of claim 20, wherein implementing the CAD scheme comprises detecting bit upsets in less than 100 nanoseconds in semiconductor storage elements including SRAMs, SRFs and TCAMs.

23. The method of claim 20, further comprising configuring the state machine to implement a CAD-C scheme to correct bit-upset errors without requiring ECC bits and ECC logic by further using a parity bits block to facilitate error detection by identifying a content of corresponding locations of the configuration memories that contains errors to block content containing errors from being used, wherein the CAD-C scheme is configured to correct errors automatically without requiring software intervention within less than 100 nanoseconds even with a full traffic load.

* * * * *